(12) United States Patent
Huang et al.

(10) Patent No.: US 8,274,798 B2
(45) Date of Patent: Sep. 25, 2012

(54) CARRIER SUBSTRATE AND METHOD FOR MAKING THE SAME

(75) Inventors: Shih-Jung Huang, Taoyuan County (TW); Wen-Fang Liu, Taoyuan County (TW); Ling-Kai Su, Taipei (TW)

(73) Assignee: Unimicron Technology Corp., Kwei-San Industrial Zone, Taoyuan (TW)

( * ) Notice: Subject to any disclaimer, the term of this patent is extended or adjusted under 35 U.S.C. 154(b) by 195 days.

(21) Appl. No.: 12/845,717

(22) Filed: Jul. 28, 2010

(65) Prior Publication Data

US 2012/0026708 A1    Feb. 2, 2012

(51) Int. Cl.
*H01R 9/00* (2006.01)

(52) U.S. Cl. ........ 361/772; 361/773; 361/774; 361/783; 257/727

(58) Field of Classification Search .................. None
See application file for complete search history.

(56) References Cited

U.S. PATENT DOCUMENTS

| 5,049,084 | A  | * | 9/1991  | Bakke ............................. 439/66 |
| 6,242,803 | B1 | * | 6/2001  | Khandros et al. ............. 257/750 |
| 6,899,549 | B2 | * | 5/2005  | DeFord ........................... 439/71 |
| 6,917,102 | B2 | * | 7/2005  | Zhou et al. ..................... 257/698 |
| 7,114,959 | B2 | * | 10/2006 | Stone et al. ..................... 439/66 |
| 7,330,039 | B2 | * | 2/2008  | Khandros et al. ......... 324/754.08 |
| 7,458,816 | B1 | * | 12/2008 | Mathieu et al. ................ 439/66 |
| 7,989,945 | B2 | * | 8/2011  | Williams et al. .............. 257/692 |
| 2008/0239683 | A1 | * | 10/2008 | Brodsky et al. .............. 361/760 |

FOREIGN PATENT DOCUMENTS

| TW | I273145 | 2/2007 |
| TW | I281368 | 5/2007 |
| TW | I287895 | 10/2007 |

* cited by examiner

*Primary Examiner* — Boris Chervinsky
(74) *Attorney, Agent, or Firm* — Winston Hsu; Scott Margo

(57) ABSTRACT

A carrier substrate includes a substrate having a chip side and a PCB side, a plurality of bond pads disposed on the chip side for bonding a chip, a plurality of land grid array (LGA) pads disposed on the PCB side, and a plurality of resilient flanges installed on the PCB side in an array manner. The plurality of resilient flanges electrically connects with the LGA pads correspondingly.

9 Claims, 6 Drawing Sheets

CARRIER SUBSTRATE AND METHOD FOR MAKING THE SAME

BACKGROUND OF THE INVENTION

1. Field of the Invention

The present invention relates to carrier substrates and, more particularly, to a carrier substrate having an array of contact arms disposed on a PCB side of the carrier substrate and a chip module using the same. The invention is further concerned with a method of fabricating the inventive carrier substrate.

2. Description of the Prior Art

As the input/output (I/O) pin count and circuit density of the integrated circuit (IC) chip continue to increase, the process of bonding or mounting a chip module onto a printed circuit board (PCB) becomes a big challenge. Typically, the chip module is directly mounted on the PCB by soldering such as ball grid array (BGA). However, such connections made by soldering are not reversible and the cost is high when replacement of the chip module is required after assembly.

To cope with the problem, an interposer connector or interposer has been developed, which is interposed between a chip module and a PCB. As shown in FIG. 1, an interposer 3 is disposed between a carrier substrate 1 and a PCB 2. The interposer 3 includes a substrate 30, a plurality of flexible contact members 32 mounted on a chip mounting side or chip side 3a of the substrate 30, and a plurality of solder balls mounted on a PCB side 3b of the substrate 30. The flexible contact members 32 electrically contact the land grid array (LGA) pads 12 on the bottom side 1a of the carrier substrate 1. The solder balls 34 are electrically connected to the PCB 2.

The above-described prior art has several drawbacks. For example, the assembly of the aforementioned interposer is more complex and is thus more expensive. Further, the interposer between the chip and the PCB increase the signal transmission distance, whereby reducing the device performance. Besides, the interposer increases the total thickness of the circuit board assembly and is therefore not feasible for some applications for which the assembly space is limited.

SUMMARY OF THE INVENTION

It is therefore one objective of the invention to provide an improved carrier substrate (or chip carrier) and chip module using such inventive carrier substrate, in order to solve the above-described prior art problems.

According to one preferred embodiment of the invention, a carrier substrate includes a substrate having a chip side and a PCB side; a plurality of bonding pads on the chip side for bonding a chip; a plurality of land grid array (LGA) pads on the PCB side; and an array of flexible contact arms mounted on the PCB side and electrically connected to the LGA pads respectively.

According to another preferred embodiment of the invention, a chip module includes a carrier substrate comprising a substrate having a chip side and a PCB side; a plurality of bonding pads on the chip side for bonding a chip; a plurality of land grid array (LGA) pads on the PCB side; and an array of flexible contact arms mounted on the PCB side and electrically connected to the LGA pads respectively. The chip module further includes a chip mounted on the chip side of the carrier substrate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 3-8 demonstrate a method of fabricating the carrier substrate according to this invention, wherein FIG. 3 shows a cross-section of a substrate, FIG. 4 shows a cross-section of the substrate after laminating contact arms on the PCB side, FIG. 5 shows a cross-section of the substrate after electroplating copper and nickel layers, FIG. 6 shows a cross-section of the substrate after selectively plating gold layer, FIG. 7 shows a cross-section of the substrate after the circuit trace etching process, and FIG. 8 shows a cross-section of the substrate after forming a protective coverlay.

Figure 1:
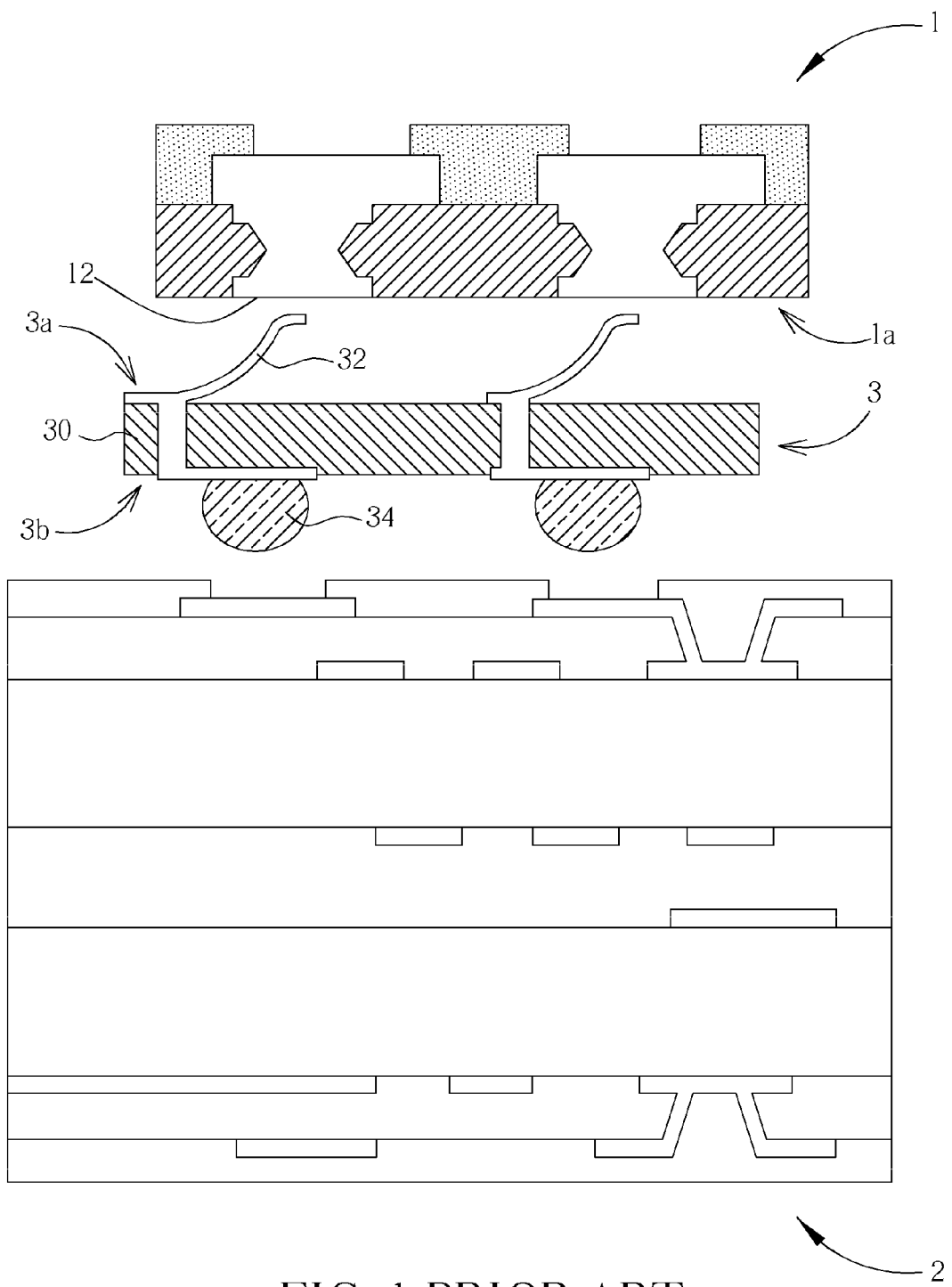
FIG. 1 is a schematic diagram showing a prior art interposer connector that is interposed between a carrier substrate of a chip module and a PCB.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

Figure 2:
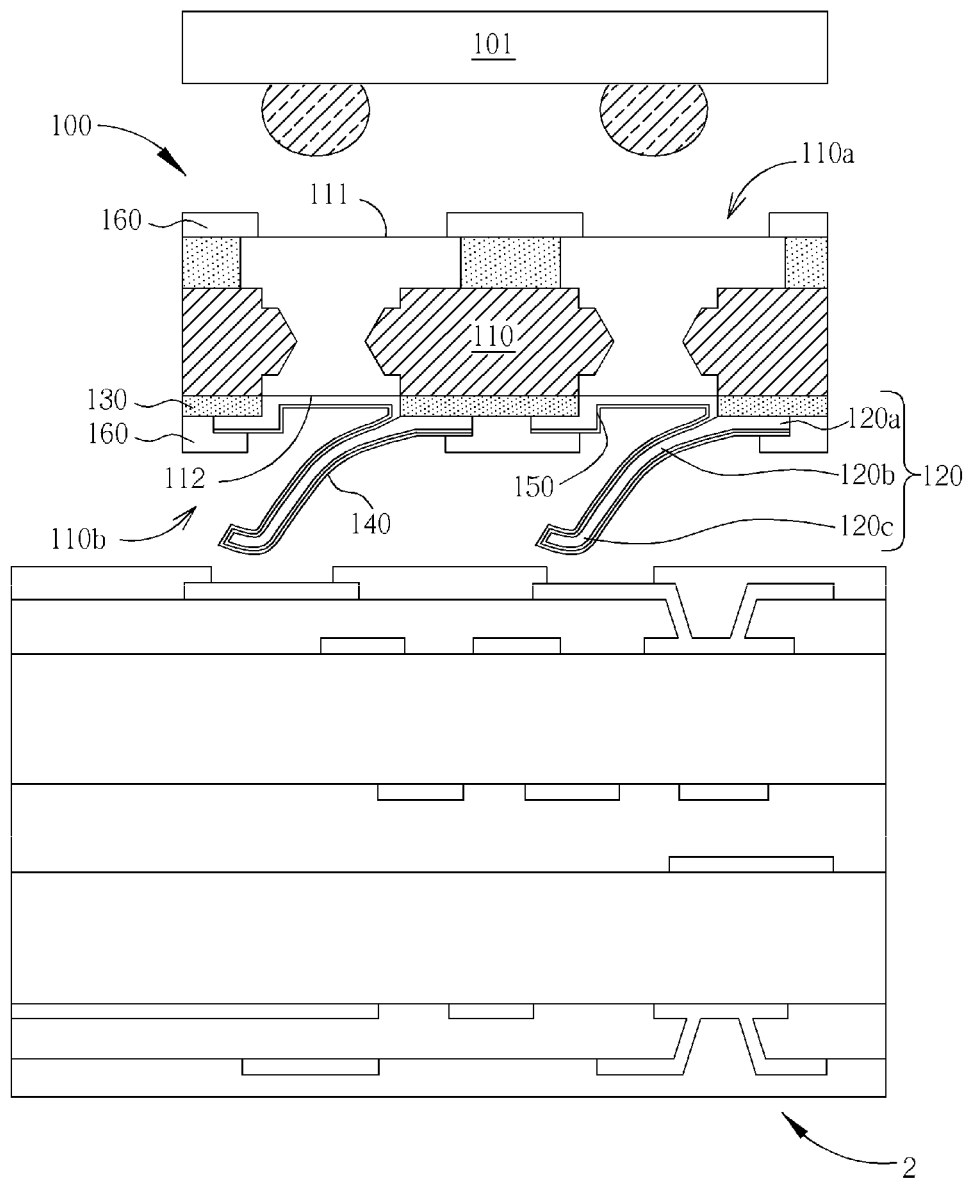
FIG. 2 is schematic, cross-sectional diagram illustrating a carrier substrate in accordance with one preferred embodiment of this invention.

Please refer to FIG. 2. FIG. 2 is schematic, cross-sectional diagram illustrating a carrier substrate in accordance with one preferred embodiment of this invention. As shown in FIG. 2, according to the preferred embodiment of the invention, the carrier substrate 100 comprises a substrate 110 such as a multi-layer laminate substrate or a single-layer laminate substrate. The substrate 110 has a chip mounting side or chip side 110a and a PCB side 110b. A plurality of bonding pads 111 are provided on the chip side 110a for bonding a chip 101. A plurality of land grid array (LGA) pads 112 are provided on the PCB side 110b that is opposite to the chip side 110a. An array of flexible contact arms 120 are jointed to the PCB side 110b and are electrically connected to the corresponding LGA pads 112.

According to the preferred embodiment of the invention, each of the flexible contact arms 120 may be a metal flange such as copper or composite metal. Each of the flexible contact arms 120 may comprise a base 120a, a slightly curved middle part 120b, and a distal contact portion 120c. The base 120a of each of the flexible contact arms 120 is jointed to the PCB side 110b of the substrate 110 using an adhesive layer 130 such as low-flow prepreg by pressing laminating methods. A selective gold plating layer 140 or other durable conductor materials such as noble metals may be formed on the surface of the flexible contact arms 120. Each of the flexible contact arms 120 is electrically connected to the corresponding LGA pad 112 through a plated via 150 that is formed in the adhesive layer 130. Further, a coverlay 160 may be formed on the adhesive layer 130.

It is one technical feature of the invention that the carrier substrate 100 is able to be directly mounted on the PCB through the flexible contact arms 120 disposed on the PCB side 110b. The chip 101 is bonded on the chip side 110a of the carrier substrate 100. By doing this, the prior art interposer connector can be spared. The advantages of the invention at least include: (1) simplified assembly process and reduced cost because the interposer connector is spared; (2) the signal transmission distance between the chip and the PCB is reduced, thereby improving the device performance; and (3) low-profile after assembly and the total thickness of the circuit board assembly is reduced.

An exemplary method of fabricating the carrier substrate 100 will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Figure 3:
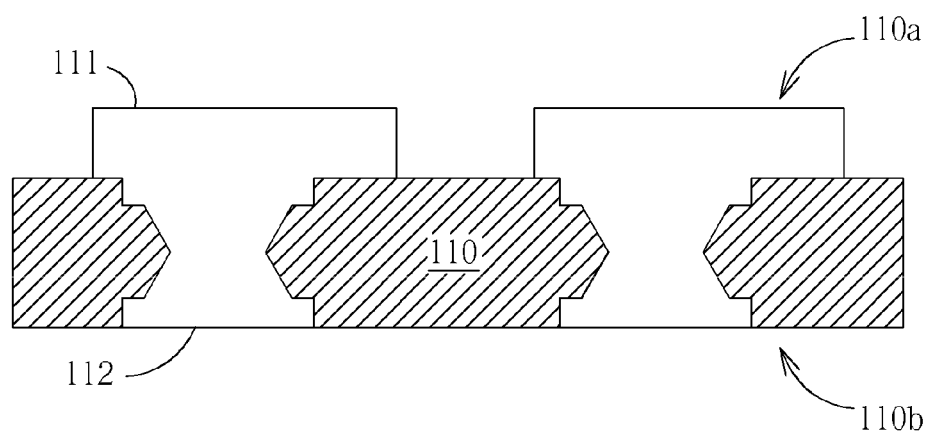
Figure 4:
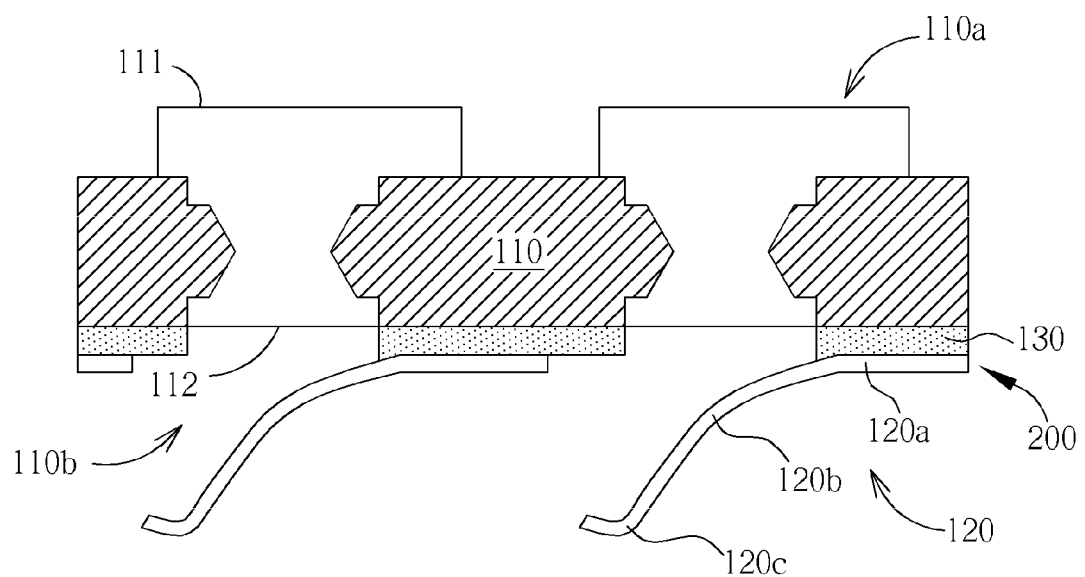

Referring to FIG. 3 to FIG. 8, the method of fabricating the carrier substrate 100 starts with a substrate 110 having a chip side 110a and a PCB side 110b. As shown in FIG. 3, a plurality of bonding pads 111 are provided on the chip side 110a for bonding a chip (not shown). A plurality of LGA pads 112 are provided on the PCB side 110b that is opposite to the chip side 110a. As shown in FIG. 4, a metal sheet 200 comprising an array of flexible contact arms 120 is laminated on the PCB side 110b using an adhesive layer 130 such as low-flow prepreg. Each of the flexible contact arms 120 may be a metal flange such as copper or composite metal. Each of the flexible contact arms 120 may comprise a base 120a, a slightly curved middle part 120b, and a distal contact portion 120c. The base 120a of each of the flexible contact arms 120 is jointed to the PCB side 110b of the substrate 110 using the adhesive layer 130 by pressing laminating methods. The array of flexible contact arms 120 on the metal sheet 200 may be formed by punching, etching or other suitable methods.

Figure 5:
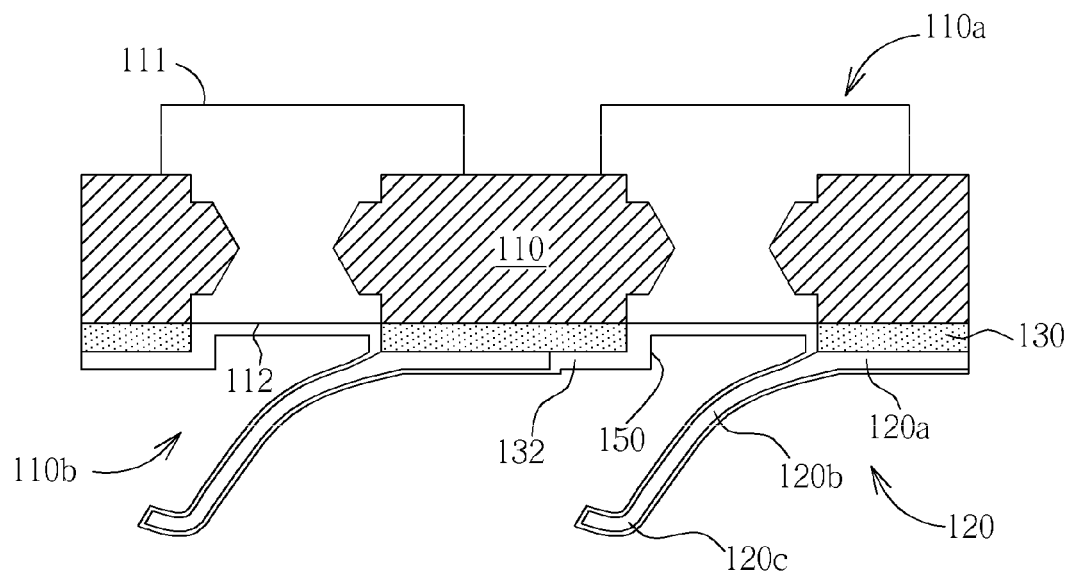
Figure 6:
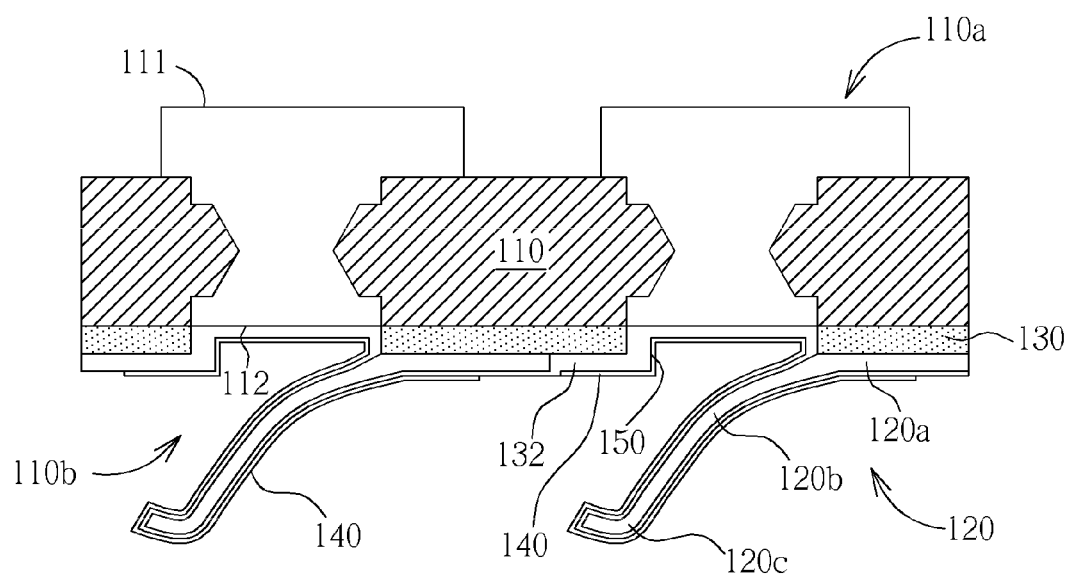
Figure 7:
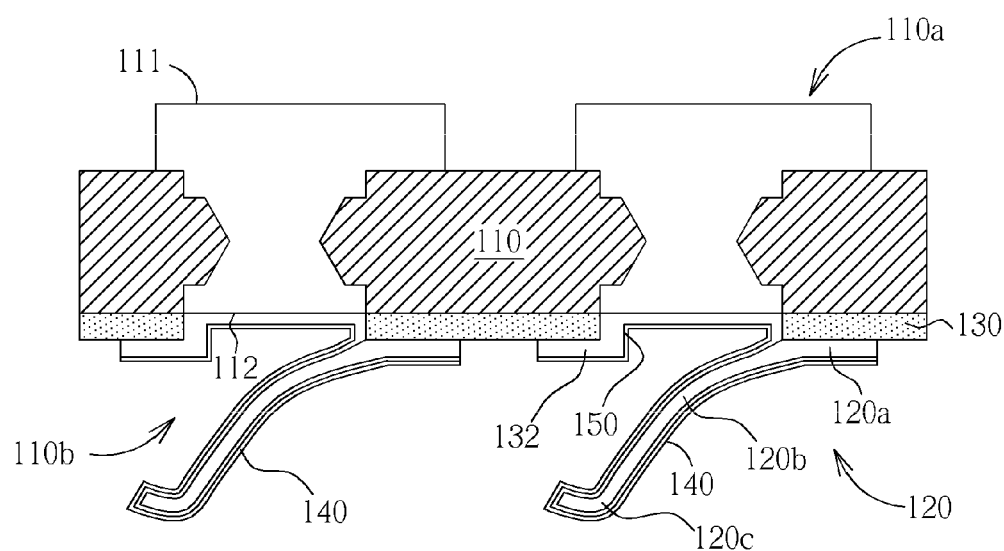
Figure 8:
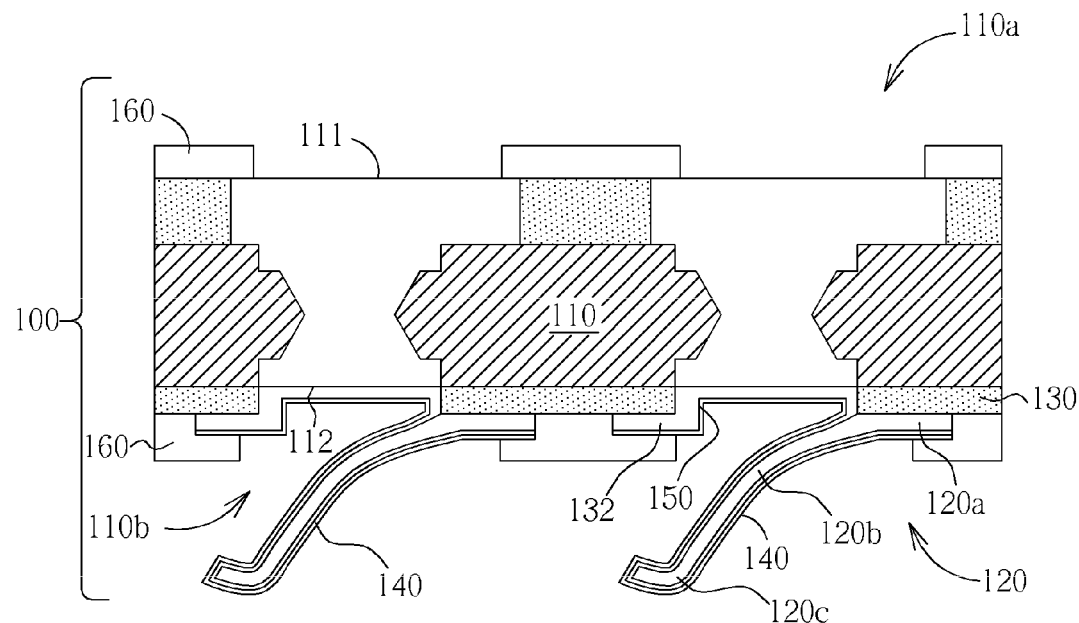

As shown in FIG. 5, an electroplating process is carried out to plate a copper/nickel composite layer 132 on the PCB side 110b of the substrate 110. A plated via 150 is formed in the adhesive layer 130. The flexible contact arm 120 is electrically connected to the LGA pad 112 through the plated via 150. As shown in FIG. 6, a selective gold plating process is performed. For example, a photoresist (not shown) is used to mask the non-gold plating area on the substrate 110. A gold layer 140 is then plated on the gold-plating area not covered by the photoresist. The surface of the flexible contact arm 120 and a portion of the copper/nickel composite layer 132 are covered with the gold layer 140. As shown in FIG. 7, after stripping the photoresist, an etching process is carried out to define the circuit trace. A portion of the metal sheet 200 and a portion of the copper/nickel composite layer 132 are removed to expose the underlying adhesive layer 130. As shown in FIG. 8, a protective coverlay 160 is formed on the adhesive layer 130. The coverlay 160 may be jointed onto the carrier substrate 100 using an adhesive layer or glue.

Figure 9:
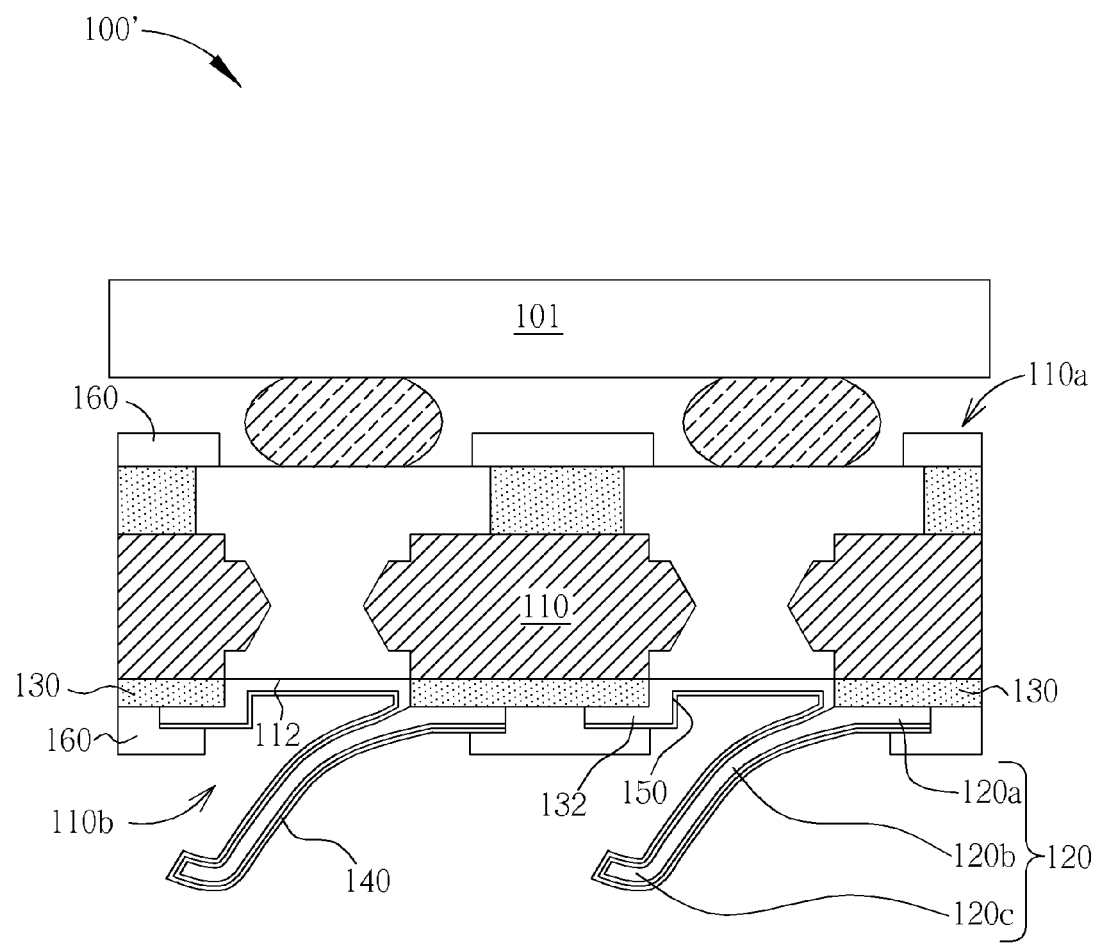
FIG. 9 is a schematic, cross-sectional diagram showing a chip module in accordance with another preferred embodiment of this invention.

FIG. 9 is a schematic, cross-sectional diagram showing a chip module 100' using the inventive carrier substrate 100 in accordance with another preferred embodiment of this invention. As shown in FIG. 9, the chip module 100' comprises a carrier substrate 100 having the same structure as that described in FIG. 8. The carrier substrate 100 comprises a substrate 110 having a chip side 110a and a PCB side 110b.

An IC chip 101 is mounted on the chip side 110a and is connected to the bonding pads 111. A plurality of LGA pads 112 and an array of flexible contact arms 120 are provided on the PCB side 110b opposite to the chip side 110a. The plurality of flexible contact arms 120 are electrically connected to the LGA pads 112 respectively. Each of the flexible contact arms 120 may be a metal flange such as copper or composite metal. Each of the flexible contact arms 120 may comprise a base 120a, a slightly curved middle part 120b, and a distal contact portion 120c.

The base 120a of each of the flexible contact arms 120 is jointed to the PCB side 110b of the substrate 110 using an adhesive layer 130 such as low-flow prepreg by pressing laminating methods. A selective gold plating layer 140 or other durable conductor materials such as noble metals may be formed on the surface of the flexible contact arms 120. Each of the flexible contact arms 120 is electrically connected to the corresponding LGA pad 112 through a plated via 150 that is formed in the adhesive layer 130. Further, a coverlay 160 may be formed on the adhesive layer 130.

Those skilled in the art will readily observe that numerous modifications and alterations of the device and method may be made while retaining the teachings of the invention.

What is claimed is:

1. A carrier substrate, comprising:
   a substrate having a chip side and a PCB side;
   a plurality of bonding pads on the chip side for bonding a chip;
   a plurality of land grid array (LGA) pads on the PCB side; and
   an array of flexible contact arms mounted on the PCB side and electrically connected to the LGA pads respectively, wherein each of the flexible contact arms is jointed to the PCB side of the substrate using low-flow prepreg, and wherein each of the flexible contact arms is electrically connected to each of the LGA pads through a plated via formed in the low-flow prepreg.

2. The carrier substrate according to claim 1 wherein each of the flexible contact arms is a metal flange.

3. The carrier substrate according to claim 1 wherein each of the flexible contact arms is composed of copper or composite metal.

4. The carrier substrate according to claim 1 wherein each of the flexible contact arms comprises a base, a middle part and a distal contact portion.

5. The carrier substrate according to claim 4 wherein the base of each of the flexible contact arms is jointed to the PCB side of the substrate.

6. The carrier substrate according to claim 5 wherein the base of each of the flexible contact arms is jointed to the PCB side of the substrate using the low-flow prepreg.

7. The carrier substrate according to claim 1 wherein a protective coverlay is disposed on the low-flow prepreg.

8. The carrier substrate according to claim 1 wherein a selective gold plating layer is formed on a surface of each of the flexible contact arms.

9. A chip module, comprising:
   a carrier substrate according to claim 1; and
   a chip mounted on the chip side of the carrier substrate.

* * * * *